(12) United States Patent
Hoeink

(10) Patent No.: US 10,180,053 B2
(45) Date of Patent: Jan. 15, 2019

(54) BOOLEAN SATISFIABILITY PROBLEM FOR DISCRETE FRACTURE NETWORK CONNECTIVITY

(71) Applicant: Tobias Hoeink, Houston, TX (US)

(72) Inventor: Tobias Hoeink, Houston, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 342 days.

(21) Appl. No.: 14/978,794

(22) Filed: Dec. 22, 2015

(65) Prior Publication Data
US 2017/0175519 A1 Jun. 22, 2017

(51) Int. Cl.
| | | |
|---|---|---|
| *E21B 43/26* | (2006.01) | |
| *G06F 17/50* | (2006.01) | |
| *G06T 17/00* | (2006.01) | |
| *E21B 49/00* | (2006.01) | |
| *E21B 47/00* | (2012.01) | |

(52) U.S. Cl.
CPC ............. *E21B 43/26* (2013.01); *E21B 49/00* (2013.01); *G06F 17/50* (2013.01); *G06F 17/504* (2013.01); *G06T 17/00* (2013.01); *E21B 47/0002* (2013.01)

(58) Field of Classification Search
CPC ...... E21B 43/26; E21B 49/00; E21B 47/0002; G06F 17/50; G06F 17/504; G06T 17/00
See application file for complete search history.

(56) References Cited

U.S. PATENT DOCUMENTS

| 7,194,710 B2* | 3/2007 | Prasad ................. G06F 17/504 |
| | | 716/106 |
| 8,131,660 B2 | 3/2012 | Davis et al. |
| 8,589,327 B2 | 11/2013 | Baumgartner et al. |
| 2004/0236545 A1 | 11/2004 | Arroyo-Figueroa |
| 2009/0262110 A1* | 10/2009 | Onodera ................. G06T 17/00 |
| | | 345/420 |

OTHER PUBLICATIONS

Aloul, et al.; "Identifiying the Shortest Path in Large Networks using Boolean Satisfiability";2006 3rd International Conference on Electrical and Electronics Engineering, 10.1109/ICEEE.2006. 251924; 4pages.
Weber, Tjark; "A SAT-based Sudoku Solver"; A SAT-based Sudoku solver. In LPAR, (2005); pp. 11-15.
International Search Report and the Written Opinion of the International Searching Authority, International Appllication No. PCT/US2016/064670; dated Mar. 20, 2017; 11 pages.

* cited by examiner

*Primary Examiner* — Yong-Suk Ro
(74) *Attorney, Agent, or Firm* — Cantor Colburn LLP

(57) ABSTRACT

A method for determining a connectivity of at least one fracture to other fractures in an earth formation includes: obtaining connectivity information for each fracture of interest in the earth formation where the connectivity information for each fracture of interest includes connections with other fractures. The method further includes converting the connectivity information for each fracture of interest into a conjunctive normal form and determining the connectivity of the at least one fracture to other fractures by solving the connectivity information for each fracture of interest in the conjunctive normal form using a Boolean Satisfiability problem solver.

14 Claims, 4 Drawing Sheets

BOOLEAN SATISFIABILITY PROBLEM FOR DISCRETE FRACTURE NETWORK CONNECTIVITY

BACKGROUND

In the quest for production of hydrocarbons, a discrete fracture network (DFN) provides information about the fractures in an earth formation that may have a reservoir of hydrocarbons. With the DFN information, a petro-analyst can estimate an amount of hydrocarbons that a well may be able to produce. From the hydrocarbon production estimates, the petro-analyst can then make decisions concerning production such as to enable efficient use of production resources. Hence, methods to quickly, accurately and efficiently process DFN information would be well received by the hydrocarbon production industry.

BRIEF SUMMARY

Disclosed is a method for determining a connectivity of at least one fracture to other fractures in an earth formation. The method includes: obtaining, by a processor, connectivity information for each fracture of interest in the earth formation, the connectivity information for each fracture of interest comprising connections with other fractures; converting, by the processor, the connectivity information for each fracture of interest into a conjunctive normal form; and determining, by the processor, the connectivity of the at least one fracture to other fractures by solving the connectivity information for each fracture of interest in the conjunctive normal form using a Boolean Satisfiability problem solver.

Also disclosed is an apparatus for determining a connectivity of at least one fracture to other fractures in an earth formation. The apparatus includes a processor configured to: obtain connectivity information for each fracture of interest in the earth formation, the connectivity information for each fracture of interest having connections with other fractures; convert the connectivity information for each fracture of interest into a conjunctive normal form; and determine the connectivity of the at least one fracture to other fractures by solving the connectivity information for each fracture of interest in the conjunctive normal form using a Boolean Satisfiability problem solver.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method presented herein by way of exemplification and not limitation with reference to the figures.

Computing fracture connectivity in large discrete fracture networks (DFNs) can be time consuming with conventional methods. As disclosed herein, the problem of computing fracture network connectivity is transformed into a propositional logic formula that can be solved a Boolean Satisfiability Problem (SAT). Boolean Satisfiability Problems can be solved very efficiently and are used extensively in artificial intelligence, circuit design and automatic theorem proving. The idea here is to transform the problem of computing fracture network connectivity into a propositional logic formula. The solution provided answers the question—Which fractures are connected to a specific fracture? Any fracture can equivalently be replaced by a wellbore or by an arbitrary boundary or location in space that is part of the DFN connectivity model.

Once the DFN connectivity is determined, it can be used to map hydrocarbon production flow in an earth formation. Using the map, a petro-analyst can make decisions regarding a hydrocarbon extraction process or even if hydrocarbon extraction should continue.

Networks of natural fractures are important contributors for fluid flow in the subsurface, and crucial in most remaining hydrocarbon reserves. However, in any realistic situation the actual physical attributes of each fracture are never known precisely. A typically used crutch employs the concept of a discrete natural fracture network (DFN), which is a discrete realization of a large number of possible realizations (ensemble) that all have the same stochastic description. Much work in the industry is focused on creating and analyzing a single (or a few at most) of those DFNs, disregarding the majority of possible realizations in the ensemble. Then, results from these singular efforts contribute to important and capital-expensive decisions. A DFN may be obtained from analysis of formation core samples and borehole logging images and sensed data such as resistivity images, nuclear magnetic resonance (NMR) images and gamma-ray data as non-limiting examples. Fracture densities, orientations and aperture distances may be extrapolated further into the formation from a borehole where the data was obtained and used to generate the hydrocarbon production flow map.

Figure 1:
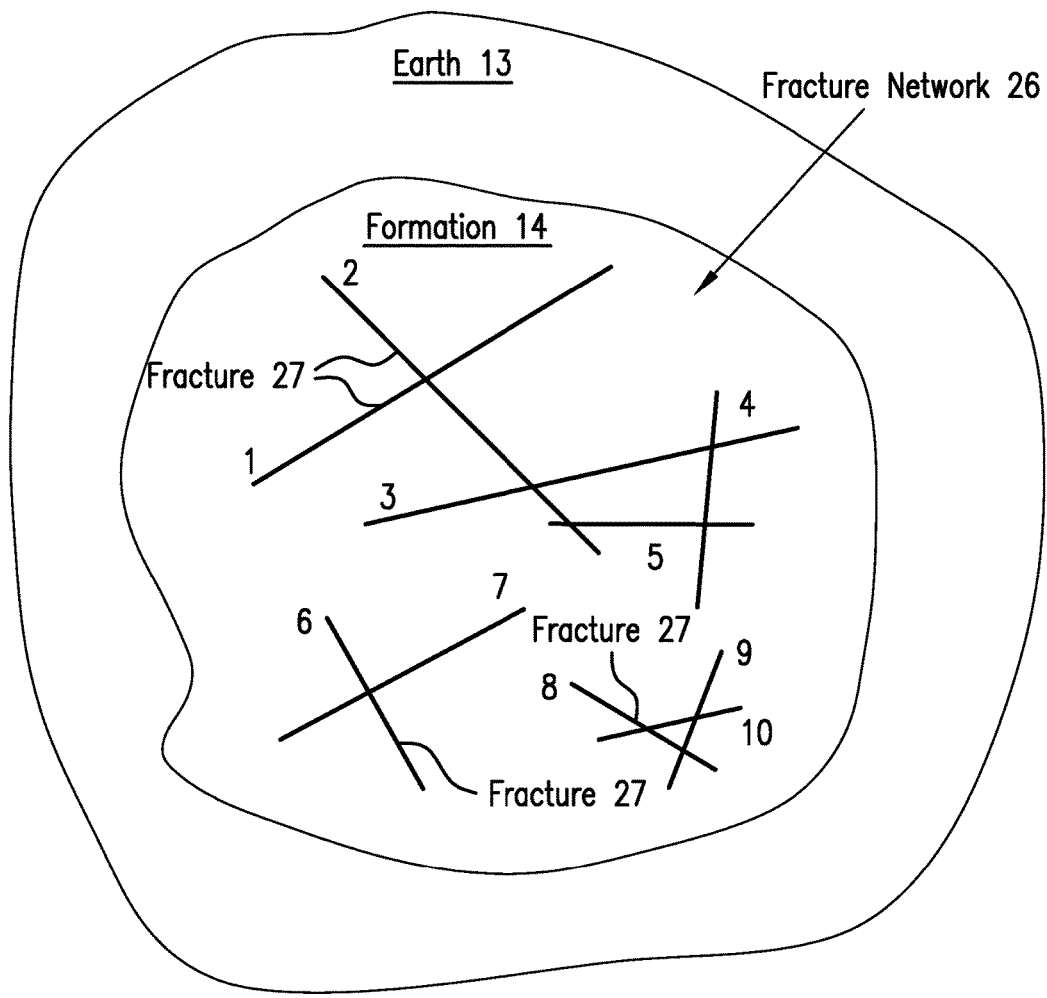
FIG. 1 depicts aspects of a fracture network.

FIG. 1 illustrates in top view an example a fracture network 26 of a formation 14 in the earth 13. The fracture network 26 includes a network of fractures 27 that may or may not be connected with other fractures. In general, the fractures 27 are fractures of rock in the formation 14. In the embodiment of FIG. 1, the fracture network 26 includes three clusters of fractures that are not connected to each other. In one or more embodiments, the fracture network 16 may be a discrete fracture network as known in the art. It can be appreciated that fractures 27 illustrated as lines in FIG. 1 represent end views of fracture planes, however, some or all of the fracture planes can have different orientations such as having normal vector components perpendicular to the plane of the illustration, parallel to the plane of the illustration or some combination thereof.

A frequent task in discrete fracture network analysis is to efficiently obtain an answer to the question which fractures are connected to a specific fracture (or wellbore), or whether two fractures are connected. The herein disclosed solution procedure or method first converts the existing fracture connectivity information (1 is connected to 2, 2 is connected to 3, etc. in FIG. 1) into a conjunctive normal form (CNF), which is a conjunction (AND operation) of one or more OR clauses of literals. A literal is a fracture occurrence (True) or its complement (False). This Boolean expression, although often lengthy, can be efficiently solved by SAT solvers.

The base CNF for the example in FIG. 1 is $$cnf=[[1,-2],[-1,2],[2,-3],[-2,3],[2,-5],[-2,5],[3,-4],\\ [-3,4],[4,-5],[-4,5],[6,-7],[-6,7],[8,-9],\ [-8,9],\\ [8,-10],[-8,10],[9,-10],[-9,10]]. \quad (1)$$

Here, fracture 1 connected to fracture 2 is represented as [1, −2]. Conversely, because fracture 2 is also connected to fracture 1, then that connection is also represented as [−1,2]. The other connections are similarly represented with two tuples for each connection.

Next, the question is posed: Which fractures are connected to fracture 1? This question can be encoded as a constraint into the final CNF by appending (1) with a term implementing the constraint.

Next, all possible solutions are obtained from the SAT solver: [1, 2, 3, 4, 5, −6, −7, −8, −9, −10]; [1, 2, 3, 4, 5, −6, −7, 8, 9, 10]; [1, 2, 3, 4, 5, 6, 7, 8, 9, 10]; [1, 2, 3, 4, 5, 6, 7, −8, −9, −10].

With respect to the fracture in question or of interest (e.g. fracture 1 in this example), all unconnected fractures are unspecified, which, by definition, means that both True and False values occur equally often in the solution space for those fractures. A convenient next step for the analysis of the solution space is thus to sum up the solutions (i.e., sum the values of each column). For this example, the result of the summation is: [4, 8, 12, 16, 20, 0, 0, 0, 0, 0]. Here, the positive values indicate that a connection with fracture 1 exists, while the zeros indicate no connection with fracture 1.

From here, one can iterate over the above answer list, or generate an answer look-up table, which answers the question "Which fracture is connected to fracture 1?":
1: True
2: True
3: True
4: True
5: True
6: False
7: False
8: False
9: False
10: False Next, SAT solvers as known in the art are discussed in detail for reference. In computer science, the Boolean Satisfiability Problem (sometimes called Propositional Satisfiability Problem and abbreviated as SATISFIABILITY or SAT) is the problem of determining if there exists an interpretation that satisfies a given Boolean formula. In other words, it asks whether the variables of a given Boolean formula can be consistently replaced by the values TRUE or FALSE in such a way that the formula evaluates to TRUE. If this is the case, the formula is called satisfiable. On the other hand, if no such assignment exists, the function expressed by the formula is identically FALSE for all possible variable assignments and the formula is unsatisfiable. For example, the formula "a AND NOT b" is satisfiable because one can find the values a=TRUE and b=FALSE, which make (a AND NOT b)=TRUE. In contrast, "a AND NOT a" is unsatisfiable.

SAT is one of the first problems that was proven to be NP-complete. This means that all problems in the complexity class NP, which includes a wide range of natural decision and optimization problems, are at most as difficult to solve as SAT. many instances of SAT that occur in practice, such as in artificial intelligence, circuit design and automatic theorem proving, can actually be solved rather efficiently using heuristical SAT-solvers. Such algorithms are not believed to be efficient on all SAT instances, but experimentally these algorithms tend to work well for many practical applications.

A propositional logic formula, also called Boolean expression, is built from variables, operators AND (conjunction, also denoted by $\wedge$), OR (disjunction, $\vee$), NOT (negation, $\neg$), and parentheses. A formula is said to be satisfiable if it can be made TRUE by assigning appropriate logical values (i.e. TRUE, FALSE) to its variables. The Boolean satisfiability problem (SAT) is, given a formula, to check whether it is satisfiable. This decision problem is of central importance in various areas of computer science, including theoretical computer science, complexity theory, algorithmics, cryptography and artificial intelligence. There are several special cases of the Boolean satisfiability problem in which the formulas are required to have a particular structure. A literal is either a variable, then called positive literal, or the negation of a variable, then called negative literal. A clause is a disjunction of literals (or a single literal). A clause is called Horn clause if it contains at most one positive literal. A formula is in conjunctive normal form (CNF) if it is a conjunction of clauses (or a single clause). For example, "x1" is a positive literal, "$\neg$x2" is a negative literal, "x1 $\vee$ $\neg$x2" is a clause, and "(x1 $\vee$ x2) $\wedge$ ($\neg$x1 $\vee$ x2 $\vee$ x3) $\wedge$ x1" is a formula in conjunctive normal form, its 1st and 3rd clause are Horn clauses, but its 2nd clause is not. The formula is satisfiable, choosing x1=FALSE, x2=FALSE, and x3 arbitrarily, since (FALSE $\vee$ $\neg$ FALSE) $\wedge$ ($\neg$ FALSE $\vee$ FALSE $\vee$ x3) $\wedge$ $\neg$ FALSE evaluates to (FALSE $\vee$ TRUE) $\wedge$ (TRUE $\vee$ FALSE $\vee$ x3) $\wedge$ TRUE, and in turn to TRUE $\wedge$ TRUE $\wedge$ TRUE (i.e. to TRUE). In contrast, the CNF formula a $\wedge$ $\neg$ a, consisting of two clauses of one literal, is unsatisfiable, since for a=TRUE and a=FALSE it evaluates to TRUE $\wedge$ $\neg$ TRUE (i.e. to FALSE) and FALSE $\wedge$ $\neg$ FALSE (i.e. again to FALSE), respectively.

For some versions of the SAT problem, it is useful to define the notion of a generalized conjunctive normal form formula, viz. as a conjunction of arbitrarily many generalized clauses, the latter being of the form R(l1, . . . , ln) for some Boolean operator R and (ordinary) literals li. Different sets of allowed Boolean operators lead to different problem versions. As an example, R($\neg$ x,a,b) is a generalized clause, and R($\neg$x,a,b) $\wedge$ R(b,y,c) $\wedge$ R(c,d,$\neg$ z) is a generalized conjunctive normal form. This formula is used below, with R being the ternary operator that is TRUE just if exactly one of its arguments is.

Using the laws of Boolean algebra, every propositional logic formula can be transformed into an equivalent conjunctive normal form, which may, however, be exponentially longer. For example, transforming the formula (x1 $\wedge$ y1) $\vee$ (x2 $\wedge$ y2) $\vee$ . . . $\vee$ (xn $\wedge$ yn) into conjunctive normal form yields (x1 $\vee$ x2 $\vee$ . . . $\vee$ xn) $\wedge$ (y1 $\vee$ x2 $\vee$ . . . $\vee$ xn) $\vee$ (x1 $\vee$ y2 $\vee$ . . . $\vee$ xn) $\wedge$ (y1 $\vee$ y2 $\vee$ . . . $\vee$ xn) $\wedge$ . . . $\wedge$ (x1 $\vee$ x2 $\vee$ . . . $\vee$ yn) $\wedge$ (y1 $\vee$ x2 $\vee$ . . . $\vee$ yn) $\wedge$ (x1 $\vee$ y2 $\vee$ . . . $\vee$ yn) $\wedge$ (y1 $\vee$ y2 $\vee$ . . . $\vee$ yn); while the former is a disjunction of n conjunctions of 2 variables, the latter consists of 2n clauses of n variables.

Next, algorithms known in the art for solving SAT problems are discussed for reference. Since the SAT problem is NP-complete, only algorithms with exponential worst-case complexity are known for it. In spite of this state of the art in complexity theory, efficient and scalable algorithms for SAT were developed over the last decade and have contributed to dramatic advances in our ability to automatically solve problem instances involving tens of thousands of variables and millions of constraints (i.e. clauses). Examples of such problems in electronic design automation (EDA) include formal equivalence checking, model checking, formal verification of pipelined microprocessors, [automatic test pattern generation, routing of FPGAs, planning, and scheduling problems, and so on. A SAT-solving engine is now considered to be an essential component in the EDA toolbox.

There are two classes of high-performance algorithms for solving instances of SAT in practice: the Conflict-Driven Clause Learning algorithm, which can be viewed as a modern variant of the DPLL algorithm (well-known implementations include Chaff and GRASP) and stochastic local search algorithms, such as WalkSAT.

A DPLL SAT solver employs a systematic backtracking search procedure to explore the (exponentially sized) space of variable assignments looking for satisfying assignments. The basic search procedure was proposed in two seminal papers in the early 1960s (see references below) and is now commonly referred to as the Davis-Putnam-Logemann-Loveland algorithm ("DPLL" or "DLL"). Theoretically, exponential lower bounds have been proved for the DPLL family of algorithms.

In contrast, randomized algorithms like the PPSZ algorithm by Paturi, Pudlak, Saks, and Zane set variables in a random order according to some heuristics, for example bounded-width resolution. If the heuristic can't find the correct setting, the variable is assigned randomly. The PPSZ algorithm has a fast runtime for 3-SAT with a single satisfying assignment. Currently this is the best known runtime for this problem. In the setting with many satisfying assignments the randomized algorithm by Schoning has a better bound.

Modern SAT solvers (developed in the last ten years) come in two types: "conflict-driven" and "look-ahead". Conflict-driven solvers augment the basic DPLL search algorithm with efficient conflict analysis, clause learning, non-chronological backtracking (a.k.a. backjumping), as well as "two-watched-literals" unit propagation, adaptive branching, and random restarts. These "extras" to the basic systematic search have been empirically shown to be essential for handling the large SAT instances that arise in electronic design automation (EDA). Look-ahead solvers have especially strengthened reductions (going beyond unit-clause propagation) and the heuristics, and they are generally stronger than conflict-driven solvers on hard instances (while conflict-driven solvers can be much better on large instances which actually have an easy instance inside).

Modern SAT solvers are also having significant impact on the fields of software verification, constraint solving in artificial intelligence, and operations research, among others. Powerful solvers are readily available as free and open source software. In particular, the conflict-driven MiniSAT only has about 600 lines of code. A modern Parallel SAT solver is ManySAT. It can achieve super linear speed-ups on important classes of problems. An example for look-ahead solvers is march_dl.

Certain types of large random satisfiable instances of SAT can be solved by survey propagation (SP). Particularly in hardware design and verification applications, satisfiability and other logical properties of a given propositional formula are sometimes decided based on a representation of the formula as a binary decision diagram (BDD).

Almost all SAT solvers include time-outs, so they will terminate in reasonable time even if they cannot find a solution. Different SAT solvers will find different instances easy or hard, and some excel at proving unsatisfiability, and others at finding solutions. All of these behaviors can be seen in the SAT solving contests.

Next, non-limiting embodiments of SAT solvers are presented. Online SAT solvers include: BoolSAT; Logictools; minisat-in-your-browser; SATRennesPA; and somerby.net/mack/logic. Offline SAT solvers include: MiniSAT; PicoSAT; Sat4j; Glucose (DIMACS-CNF format); RSat; UBCSAT (Supports unweighted and weighted clauses, both in the DIMACS-CNF format); CryptoMiniSat; Spear (Supports bit-vector arithmetic and can use the DIMACS-CNF format or the Spear format); HyperSAT; BASolver; ArgoSAT; Fast SAT Solver; zChaff; and BCSAT. In that SAT solvers are known in the art, they are not discussed further in more detail.

Next, obtaining DFN connectivity using a SAT solver is discussed in more detail. The connectivity of a Discrete Fracture Network (DFN) is a collection of connections, where each connection contains at minimum the information that two fractures intersect. If each fracture has a unique identifier, then such a connection can be represented by a tuple (i,j), where i and j, respectively, represent the identifier of each of the two fractures.

In a DFN a fracture is generally modeled as a flat patch, i.e. a piece of a plane. Obviously, not all fractures intersect; examples include parallel fractures and fractures whose geometric centers are much further apart than the sum of their spatial extents.

Figure 2:
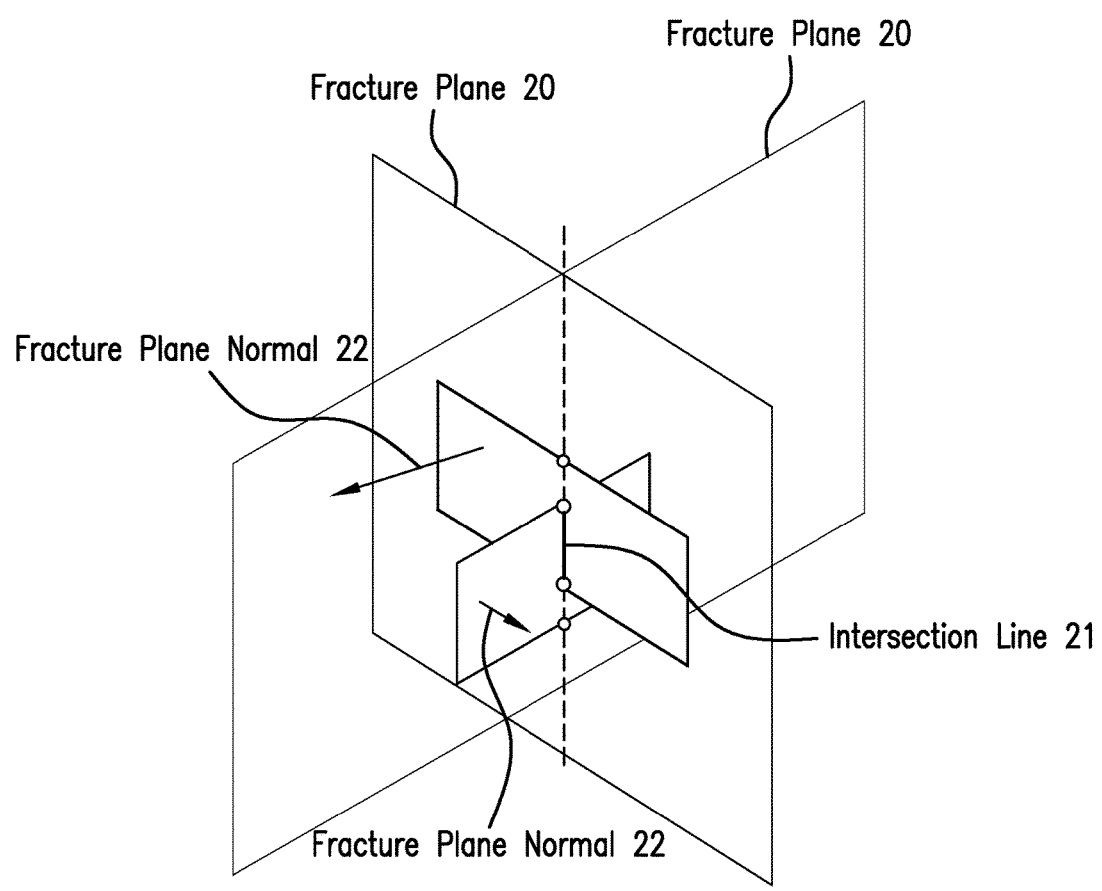
FIG. 2 depicts aspects of computation of intersection between two fracture planes.

The intersection between two fractures is a line segment, and can be determined using several methods. One method is described here with reference to FIG. 2. First, the plane in which each fracture is embedded (fracture plane 20) is identified. The fracture plane 20 can readily be represented by the fracture normal vector 22 and one point that is part of the fracture. Next, the intersection between both fracture planes is determined. This intersection is a line 21, unless both fracture normals 22 are parallel, in which case both fracture planes are parallel and the fractures do not intersect. This line cuts the outline of each fracture at two points. These four points (two from each fracture) are, by definition, all on one line. The two innermost points form the line segment that describes the intersection between the two fractures.

The above has been described in terms of a three-dimensional (3D) model, where each fracture is a 3D patch, i.e., a piece of a plane described in three dimensions. The degeneralization to two dimensions (2D) is straightforward. Also, if a 2D model, in which fractures are line segments, is considered, each fracture can be extended into a third direction and the above method used directly.

DFN connectivity information can be represented by a list of tuples, where each tuple contains two identifiers, and where each identifier uniquely identifies a fracture. An integer number may be used as a fracture identifier, but other identifiers are also possible. The DFN illustrated in FIG. 1 is used as an example for teaching purposes. In FIG. 1, the fracture network has three clusters. Fractures (i.e., fracture planes) in this example are vertical and this is a top view for easy visualization. There is no limitation in this disclosure, and it will work with fractures in any, and various, directions.

In order to use a SAT solver, the information contained the DFN connectivity has to be encoded into a form or format that SAT solvers can digest, such as a base conjunctive normal from (CNF). A CNF can be represented by a list of tuples. Each fracture connectivity (i,j) sources two tuples in a CNF, e.g. (i,−j) and (−i,j), so that the CNF for the DFN in FIG. 1 as discussed above is:

$$cnf=[(1,-2),(-1,2),(2,-3),(-2,3),(2,-5),(-2,5),(3,-4),\\(-3,4),(4,-5),(-4,5),(6,-7),(-6,7),(8,-9),(-8,9),\\(8,-10),(-8,10),(9,-10),(-9,10)].$$

If it is desired to want to know which fracture is connected to fracture i, the tuple (i) is appended at the end of the CNF. For instance, to investigate which fracture is connected to fracture 1, the final CNF is: cnf=[(1,−2),(−1,2),(2,−3),(−2, 3),(2,−5),(−2, 5), (3,−4),(−3,4),(4,−5),(−4, 5),(6,−7),(−6,7), (8,−9),(−8,9),(8,−10),(−8,10),(9,−10),(−9,10),(1)] where the "(1)" at the end of the CNF string denotes that the solution is to provide all connections with fracture 1. A "(2)" at the end of the CNF string would denote that the solution is to provide all connections with fracture 2, etc.

From here, several SAT solvers can be used, such as PicoSAT, a popular SAT solver written by Armin Biere in pure C. Ilan Schnell provided efficient Python bindings in a package called pycosat. One of the functions provided by pycosat, called itersolve, iterates over solutions. Solutions can be obtained and summated by the following Python code snippet:

ans=zeros(N)
for sol in pycosat.itersolve(cnf):
ans+=array(sol)

where zeros(N) returns an array with N zeros, and array( ) casts its argument into an array for element-wise summation.

With respect to the fracture in question (e.g. fracture 1 in this example), all unconnected fractures are unspecified, which, by definition, means that both True and False values occur equally often in the solution space for those fractures. This is why the summation is a convenient next step for the analysis of the solution space. The result obtained from the SAT solver for this example is [4, 8, 12, 16, 20, 0, 0, 0, 0, 0], the same as previously presented above. Also, as previously noted above, the answer can be iterate over, or an answer look-up table generated to answer the question "Which fracture is connected to fracture 1?" In this case, fractures 1-5 are connected to fracture 1 (i.e., True) and fractures 6-10 are not connected to fracture 1 (i.e., False).

Figure 3:
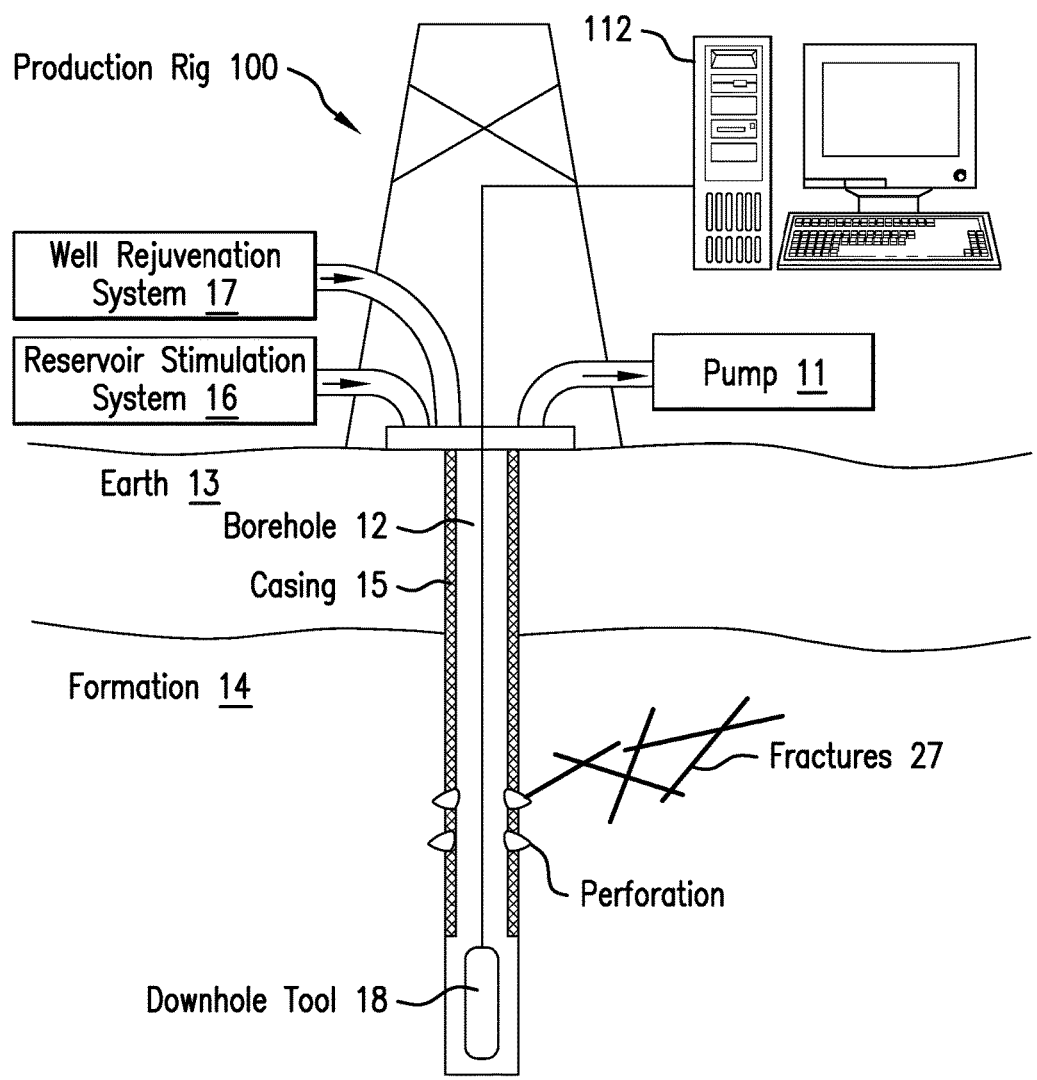
FIG. 3 depicts aspects of production equipment.

In that further actions are contemplated after fracture network connectivity is determined, production equipment for implementing those actions is now discussed. FIG. 3 depicts aspects of production equipment for producing hydrocarbons from an earth formation in a cross-sectional view. A production rig 100 is configured to perform actions related to the production of hydrocarbons from a borehole 12 (may also be referred to as a well or wellbore) penetrating the earth 13 having an earth formation 14. For example, the production rig 100 may include a pump 11 configured to pump hydrocarbons entering the borehole 12 to the surface. The formation 14 may contain a reservoir of hydrocarbons that are produced by the production rig 100. The borehole 12 may be lined by a casing 15 to prevent the borehole 12 from collapsing. The production rig 100 may include a reservoir stimulation system 16 configured to stimulate the earth formation 14 to increase the flow of hydrocarbons. In one or more embodiments, the reservoir stimulation system 16 is configured to hydraulically fracture rock in the formation 14. The production rig 100 may also include a well rejuvenation system 17 configured to rejuvenate the borehole 12 (e.g., increase hydrocarbon flow into the borehole 12). In one or more embodiments, the well rejuvenation system 17 includes an acid treatment system configured to inject acid into the borehole 12 to remove any obstructions that may be blocking the flow of hydrocarbons.

The production rig 100 may also be configured to log the formation 14 using a downhole tool 18. Non-limiting embodiments of the downhole tool 18 include a resistivity tool, a neutron tool, a gamma-ray tool, a nuclear magnetic resonance (NMR) tool, and an acoustic tool. The downhole tool 18 may be conveyed through the borehole 12 by an armored wireline that also provides communications to the surface. These tools may provide data for imaging a wall of the borehole 2 and thus image fractures in the formation 14 to determine lengths, orientation, and apertures of the fractures. The downhole tool 18 may also be configured to extract a core sample of the formation for analysis at the surface. The surface analysis may also determine lengths, orientation, and apertures of the fractures. The downhole logging and/or the surface analysis may be used to generate a DFN. Further, the downhole tool 18 maybe configured to perforate the casing 15 at selected locations to provide perforations that enable communication of formation fluids with the borehole 12.

FIG. 3 also illustrates a computer processing system 112. The computer processing system 112 is configured to implement the methods disclosed herein. Further, the computer processing system 112 may be configured to act as a controller for controlling operations of the production rig 100 to include well logging and core sample extraction and analysis. Non-limiting examples of control actions include turning equipment on or off and executing processes for formation stimulation and well rejuvenation.

Figure 4:
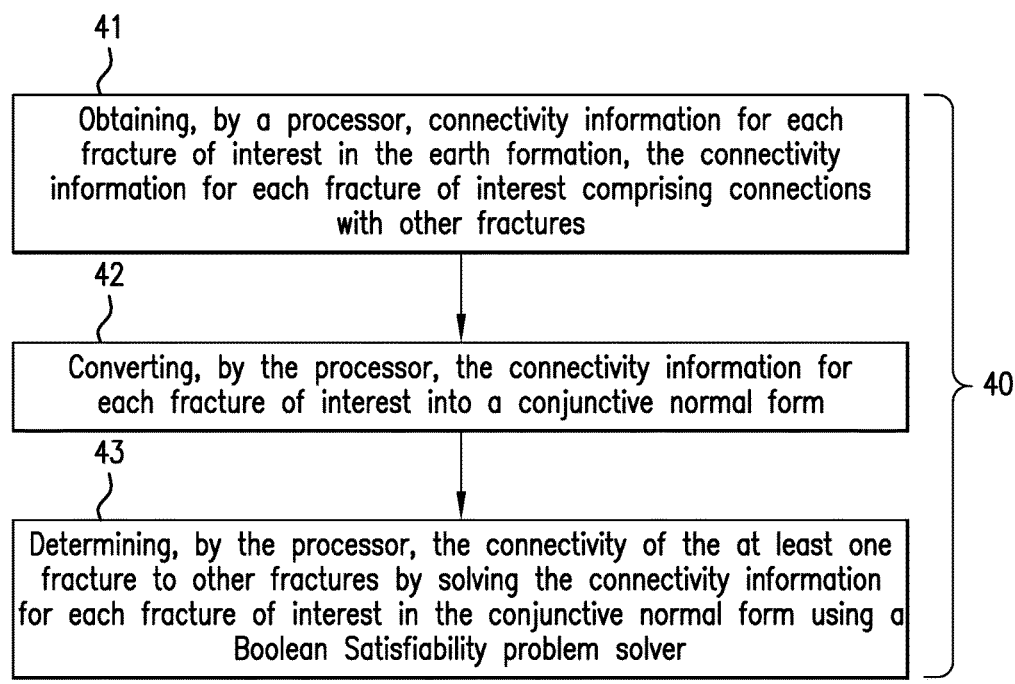
FIG. 4 is a flow chart for a method for determining connectivity of fractures in a DFN.

FIG. 4 is a flow chart for a method 40 for determining a connectivity of at least one fracture to other fractures in an earth formation. Block 41 calls for obtaining, by a processor, connectivity information for each fracture of interest in the earth formation, the connectivity information for each fracture of interest includes identification of connections with other fractures. In one or more embodiments, the fracture network is a DFN. The connectivity information may also include location information for corresponding fractures so that connectivity may be determined as function of location. In one or more embodiments, the DFN may include a discrete fracture description that describes locations, orientations and aperture distance for each fracture represented in the DFN.

Block 42 calls for converting, by the processor, the connectivity information for each fracture of interest into a conjunctive normal form. The conjunctive normal form is a form that can be processed by a SAT solver.

Block 43 calls for determining, by the processor, the connectivity of the at least one fracture to other fractures by solving the connectivity information for each fracture of interest in the conjunctive normal form using a Boolean Satisfiability problem solver.

The method 40 may also include mapping the connectivity of the at least one fracture as a function of location to provide a connectivity map using location information provided with the connectivity information. The method 40 may also include performing a production action with production equipment using the connectivity map. The map may be a virtual map stored in memory and available for display on a display monitor or a printed map. Non-limiting embodiments of production actions include new or additional stimulation such as hydraulic fracturing for example, well rejuvenation such as by acid treatment or further perforations at certain locations for example, and well abandonment activities such as ceasing operation of production activities (e.g., pumping).

The method 40 may also include estimating an additional amount of hydrocarbons that will be produced by certain production actions using the map as input to the estimating. If revenue from a production action exceeds the cost of the action, then the action may be performed. If not, then the action may not be performed. Similarly, if production at a certain well is low, then abandonment of the well may be considered using the map as input. For example, high connectivity combined with low production may indicate depletion of the reservoir.

The methods and systems disclosed herein provide several advantages. One advantage is that existing DFN connectivity translation into base CNF only takes a few lines of code and, thus, can be accomplished quickly and efficiently. Also, base CNF is in full disjunctive normal form, in which every variable appears exactly once in every conjunction. This means that the CNF can be checked in constant time, and eliminates the oftentimes exponential time requirement to convert a general SAT problem to disjunctive normal form. That is, complicated Boolean expressions can be represented by several smaller components that are easier to solve. Constraints (e.g., test connection to fracture or wellbore) can be added to base CNF. Further, SAT solvers can obtain solutions very efficiently for practical applications such as the method disclosed herein. An added advantage is that solution space can be analyzed, i.e. more than one solution can be obtained and the resulting set of solutions can be used to obtain further information such as by summing the solutions as in examples discussed above. In addition to the above advantages, Pseudo-Boolean constraints have recently been introduced into many SAT solvers, allowing optimization problems to be tackled. Fracture permeability could be used as weighting factors such that the fastest flow-path can be solved for using a SAT solver.

Set forth below are some embodiments of the foregoing disclosure:

Embodiment 1

A method for determining a connectivity of at least one fracture to other fractures in an earth formation, the method comprising: obtaining, by a processor, connectivity information for each fracture of interest in the earth formation, the connectivity information for each fracture of interest comprising connections with other fractures; converting, by the processor, the connectivity information for each fracture of interest into a conjunctive normal form; and determining, by the processor, the connectivity of the at least one fracture to other fractures by solving the connectivity information for each fracture of interest in the conjunctive normal form using a Boolean Satisfiability problem solver.

Embodiment 2

The method according to claim 1, further comprising determining, by the processor, connectivity for each fracture of interest with a borehole penetrating the earth formation.

Embodiment 3

The method according to claim 1, wherein the connectivity information of each fracture of interest further comprises a location of the fracture of interest and the method further comprises mapping the connectivity of the at least one fracture as a function of location to provide a connectivity map.

Embodiment 4

The method according to claim 3, further comprising performing a production action with production equipment using the connectivity map.

Embodiment 5

The method according to claim 4, wherein the production action comprises stimulating the earth formation, rejuvenating a wellbore used for production of the hydrocarbons, ceasing hydrocarbon production activities, or performing abandonment activities for the wellbore.

Embodiment 6

The method according to claim 4, wherein the connectivity map is at least one of a virtual map and a printed map.

Embodiment 7

The method according to claim 1, wherein each fracture or interest is uniquely identified.

Embodiment 8

The method according to claim 1, wherein the connectivity information is obtained from a discrete fracture network.

Embodiment 9

An apparatus for determining a connectivity of at least one fracture to other fractures in an earth formation, the apparatus comprising: a processor configured to: obtain connectivity information for each fracture of interest in the earth formation, the connectivity information for each fracture of interest comprising connections with other fractures; convert the connectivity information for each fracture of interest into a conjunctive normal form; and determine the connectivity of the at least one fracture to other fractures by solving the connectivity information for each fracture of interest in the conjunctive normal form using a Boolean Satisfiability problem solver.

Embodiment 10

The apparatus according to claim 9, wherein the processor is further configured to determine connectivity for each fracture of interest with a borehole penetrating the earth formation.

Embodiment 11

The apparatus according to claim 9, wherein the connectivity information of each fracture of interest further comprises a location of the fracture of interest and the method further comprises mapping the connectivity of the at least one fracture as a function of location to provide a connectivity map.

Embodiment 12

The apparatus according to claim 11, further comprising production equipment configured to perform a production action using the connectivity map.

Embodiment 13

The apparatus according to claim 12, wherein the production equipment comprises a hydraulic stimulation apparatus.

Embodiment 14

The apparatus according to claim 12, wherein the production equipment comprises an acid treatment system.

In support of the teachings herein, various analysis components may be used, including a digital and/or an analog system. For example, the production rig 100, the downhole tool 18, and/or the computer processing system 112 may include digital and/or analog systems. The system may have components such as a processor, storage media, memory, input, output (e.g. display or printer), communications link, user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure. Processed data such as a result of an implemented method may be transmitted as a signal via a processor output interface to a signal receiving device. The signal receiving device may be a computer display or a printer for presenting the result to a user. Alternatively or in addition, the signal receiving device may be a storage medium or memory for storing the result. Further, an alert maybe transmitted from the processor to a user interface if the result exceeds or is less than a threshold value. Further, the result may be transmitted to a controller or processor for executing an algorithm related to production that uses the result as input.

Elements of the embodiments have been introduced with either the articles "a" or "an." The articles are intended to mean that there are one or more of the elements. The terms "including" and "having" and the like are intended to be inclusive such that there may be additional elements other than the elements listed. The conjunction "or" when used with a list of at least two terms is intended to mean any term or combination of terms. The term "configured" relates one or more structural limitations of a device that are required for the device to perform the function or operation for which the device is configured.

The flow diagram depicted herein is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

While one or more embodiments have been shown and described, modifications and substitutions may be made thereto without departing from the spirit and scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for determining a connectivity of at least one fracture in a plurality of identified fractures in an earth formation to other fractures in the plurality, the method comprising:
    obtaining, by a processor, connectivity information for each fracture in the plurality, the connectivity information for each fracture in the plurality comprising connections with other fractures in the plurality;
    converting, by the processor, the connectivity information for each fracture in the plurality into a conjunctive normal form; and
    determining, by the processor, the connectivity of the at least one fracture in the plurality to other fractures in the plurality by solving the connectivity information for each fracture in the plurality in the conjunctive normal form using a Boolean Satisfiability problem solver.

2. The method according to claim 1, further comprising determining, by the processor, connectivity for each fracture of interest with a borehole penetrating the earth formation.

3. The method according to claim 1, wherein the connectivity information of each fracture of interest further comprises a location of the fracture of interest and the method further comprises mapping the connectivity of the at least one fracture as a function of location to provide a connectivity map.

4. The method according to claim 3, further comprising performing a production action with production equipment using the connectivity map.

5. The method according to claim 4, wherein the production action comprises stimulating the earth formation, rejuvenating a wellbore used for production of the hydrocarbons, ceasing hydrocarbon production activities, or performing abandonment activities for the wellbore.

6. The method according to claim 4, wherein the connectivity map is at least one of a virtual map and a printed map.

7. The method according to claim 1, wherein each fracture or interest is uniquely identified.

8. The method according to claim 1, wherein the connectivity information is obtained from a discrete fracture network.

9. An apparatus for determining a connectivity of at least one fracture in a plurality of identified fractures in an earth formation to other fractures in the plurality, the apparatus comprising:
    a processor configured to:
    obtain connectivity information for each fracture in the plurality, the connectivity information for each fracture in the plurality comprising connections with other fractures in the plurality;
    convert the connectivity information for each fracture in the plurality into a conjunctive normal form; and
    determine the connectivity of the at least one fracture in the plurality to other fractures in the plurality by solving the connectivity information for each fracture in the plurality in the conjunctive normal form using a Boolean Satisfiability problem solver.

10. The apparatus according to claim 9, wherein the processor is further configured to determine connectivity for each fracture of interest with a borehole penetrating the earth formation.

11. The apparatus according to claim 9, wherein the connectivity information of each fracture of interest further comprises a location of the fracture of interest and the processor is further configure to map the connectivity of the at least one fracture as a function of location to provide a connectivity map.

12. The apparatus according to claim 11, further comprising production equipment configured to perform a production action using the connectivity map.

13. The apparatus according to claim 12, wherein the production equipment comprises a hydraulic stimulation apparatus.

14. The apparatus according to claim 12, wherein the production equipment comprises an acid treatment system.

* * * * *